(12) United States Patent
Ezawa et al.

(10) Patent No.: US 11,323,046 B2
(45) Date of Patent: May 3, 2022

(54) VIBRATION UNIT HAVING A PIEZOELECTRIC ELEMENT AS THE VIBRATION SOURCE

(71) Applicant: TDK CORPORATION, Tokyo (JP)

(72) Inventors: Atsushi Ezawa, Tokyo (JP); Takuto Horii, Tokyo (JP); Atsuko Murakoshi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 257 days.

(21) Appl. No.: 16/650,014

(22) PCT Filed: Sep. 13, 2018

(86) PCT No.: PCT/JP2018/034043
§ 371 (c)(1),
(2) Date: Mar. 24, 2020

(87) PCT Pub. No.: WO2015/059101
PCT Pub. Date: Mar. 28, 2019

(65) Prior Publication Data
US 2020/0295676 A1 Sep. 17, 2020

(30) Foreign Application Priority Data
Sep. 25, 2017 (JP) .............................. JP2017-183975

(51) Int. Cl.
*H02N 2/00* (2006.01)
*B06B 1/06* (2006.01)

(52) U.S. Cl.
CPC ........... *H02N 2/005* (2013.01); *B06B 1/0648* (2013.01); *H02N 2/004* (2013.01)

(58) Field of Classification Search
CPC .... H02N 2/005; H02N 2/004; H01L 41/0973; B06B 1/0648; B06B 1/0629; G06F 3/01; G06F 3/041
See application file for complete search history.

(56) References Cited

U.S. PATENT DOCUMENTS

2010/0151344 A1* 6/2010 Otomaru ........... H01M 8/04201
429/444
2013/0286572 A1 10/2013 Tsurusaki
(Continued)

FOREIGN PATENT DOCUMENTS

| JP | 2014-164429 A | 9/2014 |
| JP | 2015-527724 A | 9/2015 |
| WO | 2012/096113 A1 | 7/2012 |

OTHER PUBLICATIONS

Nov. 13, 2018 Search Report issued in International Patent Application No. PCT/JP2018/034043.
(Continued)

*Primary Examiner* — Emily P Pham
(74) *Attorney, Agent, or Firm* — Oliff PLC

(57) ABSTRACT

In a vibration unit, a piezoelectric element enters an internal space of a through hole; and thereby, a second case member can be arranged proximate to a first case member. Therefore, a thickness of the vibration unit can be reduced, namely, a height of the vibration unit can be reduced. As described above, since the thickness of the vibration unit is reduced, a size of the vibration unit can be reduced.

7 Claims, 8 Drawing Sheets

(56) References Cited

U.S. PATENT DOCUMENTS

2014/0305783 A1* 10/2014 Kagayama ............ G06F 3/0338
  200/521
2015/0091414 A1   4/2015 Lonnberg et al.

OTHER PUBLICATIONS

Mar. 31, 2020 International Preliminary Report on Patentability issued in International Patent Application No. PCT/JP2018/034043.

* cited by examiner

VIBRATION UNIT HAVING A PIEZOELECTRIC ELEMENT AS THE VIBRATION SOURCE

CROSS-REFERENCE TO RELATED APPLICATIONS

This application is a 35 U.S.C. § 371 national phase application of PCT/JP2018/0034043, filed on Sep. 13, 2018, which claims priority to Japanese Patent Application No. 2017-183975, filed on Sep. 25, 2017.

TECHNICAL FIELD

The present disclosure relates to a vibration unit.

BACKGROUND ART

In the related art, there is known a technique of repeatedly expanding and contracting a piezoelectric element to convert the expansion and contraction thereof into vibrations. Patent Literature 1 referred below discloses a vibration unit that detects a pressure occurring when an overlay is pressed down with the finger and includes a piezoelectric element having a sheet shape which generates sensible vibrations in the overlay. In a vibration unit disclosed in this literature, a piezoelectric element, a disk, and a circuit board are arranged in order from proximity to the overlay on a surface opposite to a front surface of an overlay which is pressed down with the finger. In addition, the circuit board is provided with a circular opening that allows the displacement (bending) of the disk in a thickness direction of the disk which is induced by the expansion and contraction of the piezoelectric element.

CITATION LIST

Patent Literature

Patent Literature 1: Japanese Unexamined Patent Publication No. 2015-527724

SUMMARY OF INVENTION

Technical Problem

The inventors have repeated research to reduce the size of the vibration unit, and have found a new technique capable of reducing the size of the vibration unit by reducing the thickness thereof.

An object of the present disclosure is to provide a vibration unit of which the size is reduced.

Solution to Problem

According to one aspect of the present disclosure, there is provided a vibration unit including a first case portion having a plate shape, a second case portion having a plate shape and extending parallel to the first case portion, and a vibration device that is arranged on a second case portion side of the first case portion, and can vibrate in a thickness direction of the first case portion. The vibration device includes a vibration plate of which one main surface is in contact with the first case portion, and a piezoelectric element having a sheet shape which is arranged on the other main surface of the vibration plate and can expand and contract in an in-plane direction of the vibration plate. A hole which is not in contact with the other main surface of the vibration plate is provided in the second case portion. The vibration plate includes a supported portion that is positioned outside an edge of the hole as seen from the thickness direction of the first case portion, and the supported portion of the vibration plate is supported on the second case portion. An entire outer edge of the piezoelectric element is present inside the edge of the hole as seen from the thickness direction of the first case portion, and at least a part of the piezoelectric element enters an internal space of the hole in the thickness direction of the first case portion.

In the vibration unit, one main surface of the vibration plate of the vibration device is in contact with the first case portion, and at least a part of the piezoelectric element arranged on the other main surface of the vibration plate enters the internal space of the hole of the second case portion that supports the vibration plate. Therefore, it is possible to realize a size reduction of the vibration unit by reducing the thickness thereof.

In the vibration unit according to another aspect, a plurality of the vibration devices are arranged on the second case portion side of the first case portion, and a plurality of the holes which correspond to the plurality of vibration devices are provided in the second case portion. In this case, it is possible to realize a size reduction of the vibration unit including the plurality of vibration devices.

In the vibration unit according to another aspect, the vibration plate of each of the plurality of vibration devices has a rectangular plate shape having long sides and short sides and long side directions of the vibration plates are aligned in the same direction, the plurality of vibration devices form at least one row that lines up along the long side direction of the vibration plate, and a short side part which is a supported portion of the vibration plate is supported on the second case portion. In this case, in the vibration unit where the plurality of vibration devices are arrayed, it is possible to suppress a mutual influence between the vibrations of the vibration plates of the plurality of vibration devices.

In the vibration unit according to another aspect, the vibration plate of each of the plurality of vibration devices has a square plate shape having a pair of first sides parallel to each other and a pair of second sides different from the first sides, the plurality of vibration devices are arranged in a matrix pattern along a first direction parallel to the first sides and a second direction parallel to the second sides, and the plurality of vibration devices are arranged in the first direction and the second direction such that first vibration devices in each of which only a first side part which is a supported portion of the vibration plate is supported on the second case portion are adjacent to second vibration devices in each of which only a second side part which is a supported portion of the vibration plate is supported on the second case portion. In this case, in the vibration unit where the plurality of vibration devices are arrayed, it is possible to suppress a mutual influence between the vibrations of the vibration plates of the plurality of vibration devices.

The vibration unit according to another aspect further includes a support member that is interposed between the supported portion of the vibration plate and the second case portion. In this case, vibrations occurring in the vibration plate are attenuated in the support member; and thereby, it is possible to suppress the transmission of the vibrations from the vibration plate to the second case portion.

The vibration unit according to another aspect further includes a bonding portion that is interposed between the first case portion and the second case portion and fixes the first case portion to the second case portion in a bonding manner. In this case, it is possible to suppress an offset in relative position between the first case portion and the second case portion.

In the vibration unit according to another aspect, a modulus of elasticity of the first case portion is lower than a modulus of elasticity of the second case portion. In this case, the first case portion is flexed a sufficient amount, and the vibration of the vibration device is efficiently transmitted to the first case portion.

Advantageous Effects of Invention

According to the present disclosure, there is provided the vibration unit of which the size is reduced.

DESCRIPTION OF EMBODIMENTS

Hereinafter, embodiments of the present disclosure will be described in detail with reference to the accompanying drawings. Incidentally, the same reference signs are assigned to the same or equivalent elements, and when descriptions are repeated, the descriptions will be omitted.

Figure 1:
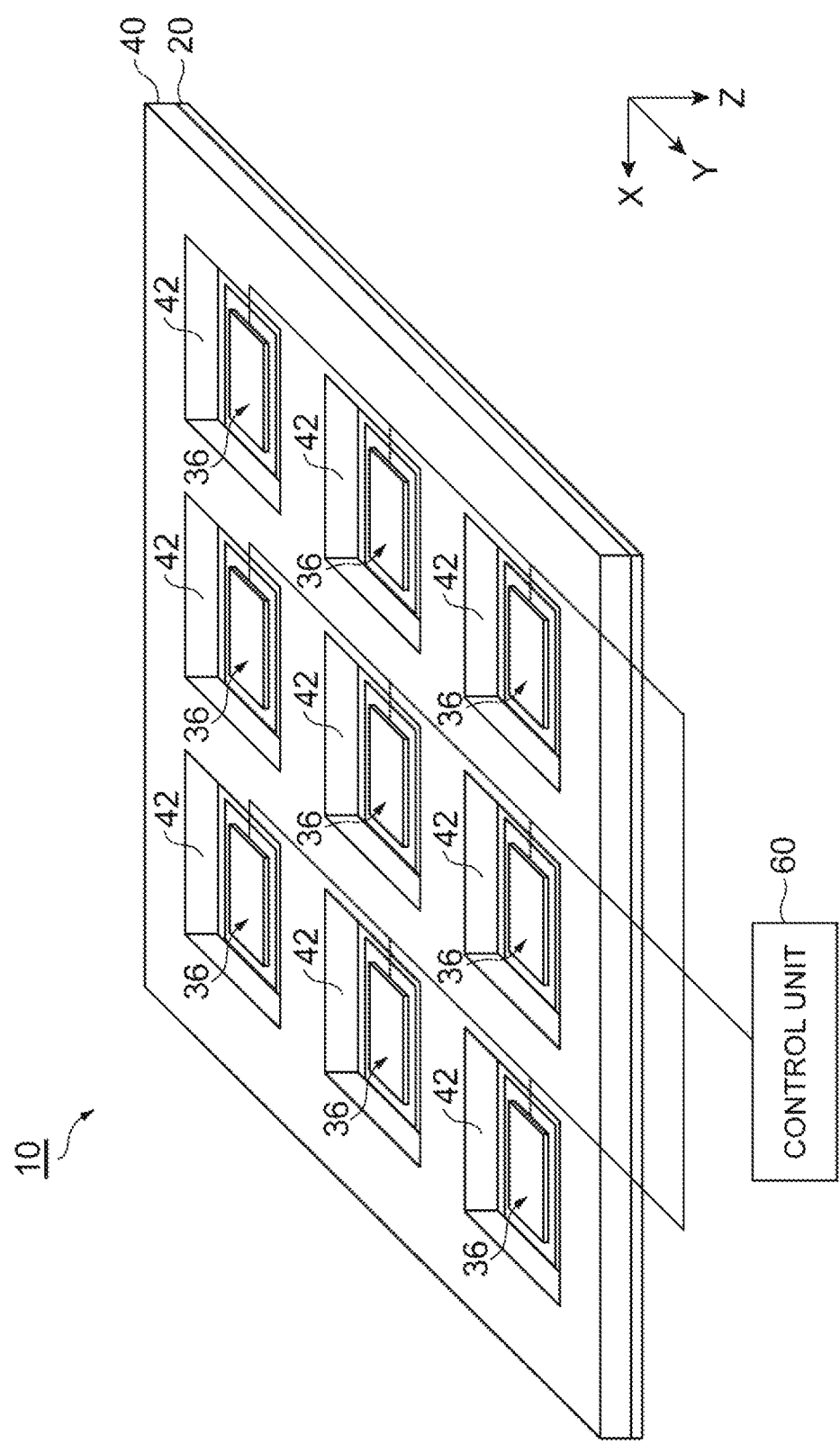
FIG. 1 is a schematic perspective view illustrating a back surface of a vibration unit according to an embodiment.

Firstly, the entire configuration of a vibration unit 10 according to an embodiment will be described with reference to FIGS. 1 to 3.

The vibration unit 10 includes a first case member (first case portion) 20 having a plate shape. The first case member 20 is configured such that one main surface 20a can be contacted by, for example, the finger of the human. As illustrated in FIG. 3, a plurality of contact regions 22 are provided in one main surface 20a of the first case member 20. In this embodiment, nine contact regions 22 with a square shape are arranged in the pattern of a matrix with three columns and three rows in the main surface 20a of the first case member 20. The first case member 20 has such a relatively low modulus of elasticity that when there is contact with the contact region 22, the first case member 20 is sufficiently deformed in a flexural manner. The first case member 20 can be made of a resin material such as polycarbonate.

Hereinafter, for convenience of description, one of arrangement directions of the contact regions 22 of the main surface 20a of the first case member 20 is referred to as an X direction and the other is referred to as a Y direction. The thickness direction of the first case member 20 is referred to as a Z direction.

The vibration unit 10 includes a second case member (second case portion) 40 having a plate shape. The second case member 40 extends parallel to the first case member 20 in a state where the second case member 40 is spaced a predetermined distance apart from the first case member 20. In the second case member 40, a region corresponding to each of the contact regions 22 of the first case member 20 is open, and the open part is a through hole (hole) 42. Namely, similar to the contact region 22, the through hole 42 has a square shape as seen from the Z direction, and a plurality of the through holes 42 are arranged in the pattern of a matrix with three columns and three rows. The second case member 40 can be made of a resin material such as acryl.

A plurality of vibration devices 36 are arranged on a second case member 40 side of the first case member 20. In this embodiment, nine vibration devices 36 are arranged at positions corresponding to the positions of the contact regions 22 and the through holes 42 described above. Namely, nine vibration devices 36 are arranged in the pattern of a matrix of three columns and three rows. Each of the vibration devices 36 includes a piezoelectric element 32 and a vibration plate 34.

The vibration plate 34 is a plate shaped member with a rectangular shape having long sides and short sides. The vibration plate 34 can be made of, for example, a nickel alloy or stainless steel. The entirety of one main surface 34a of the vibration plate 34 is in direct contact with a main surface 20b on the second case member 40 side of the first case member 20. The piezoelectric element 32 is bonded to the other main surface 34b of the vibration plate 34.

Figure 2:
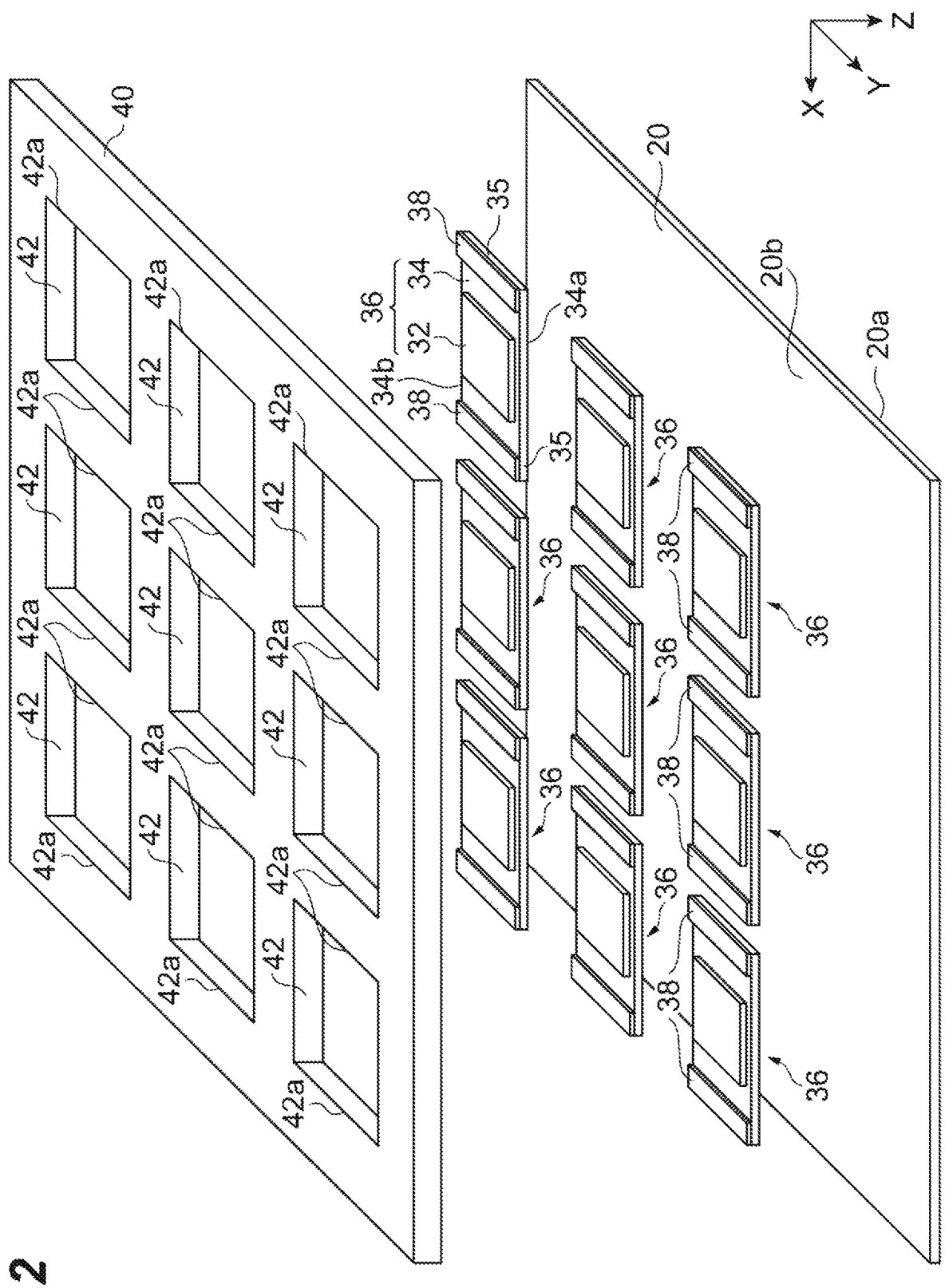
FIG. 2 is an exploded perspective view of the vibration unit illustrated in FIG. 1.
Figure 3:
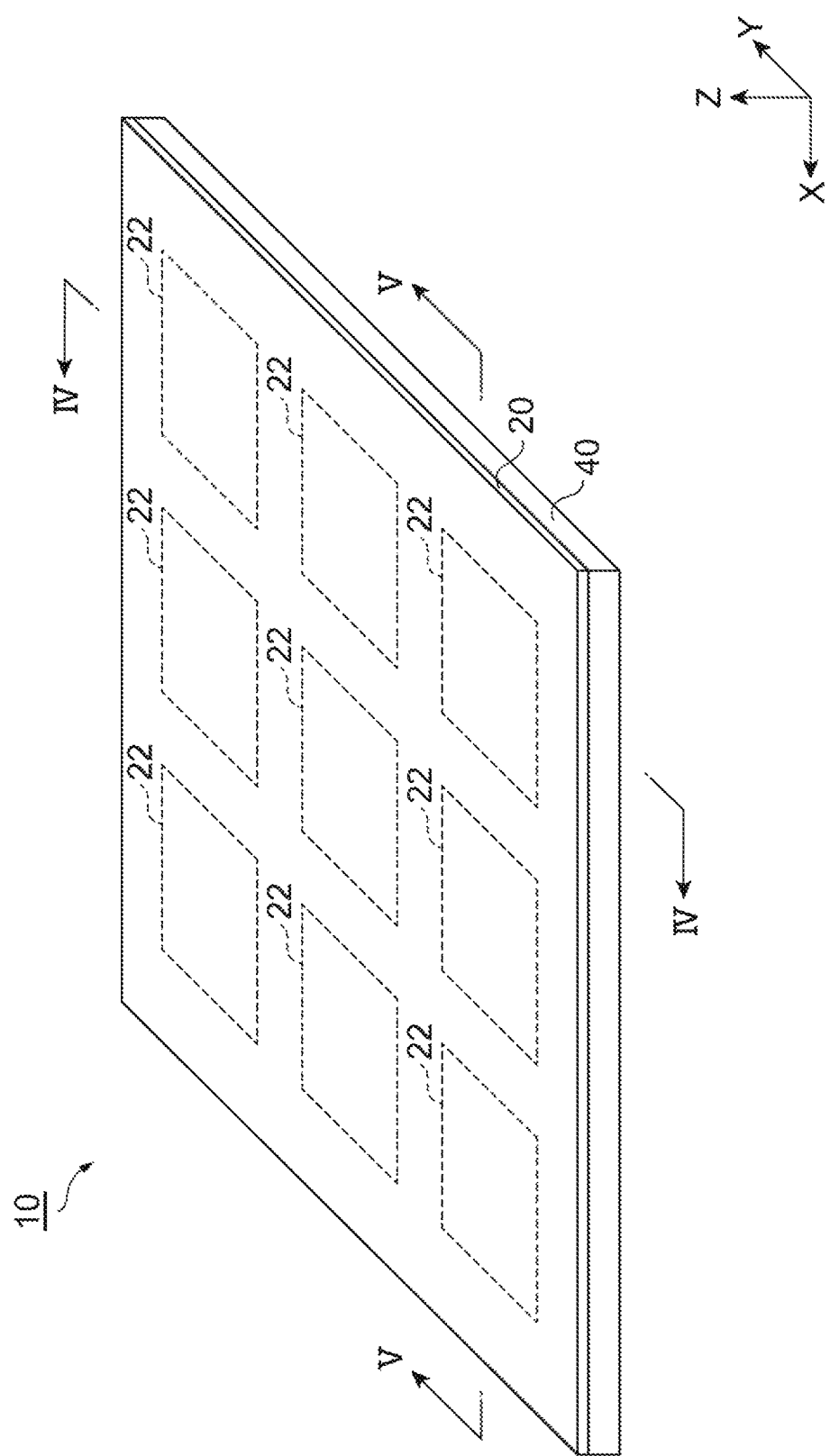
FIG. 3 is a schematic perspective view illustrating a front surface of the vibration unit illustrated in FIG. 1.
Figure 4:
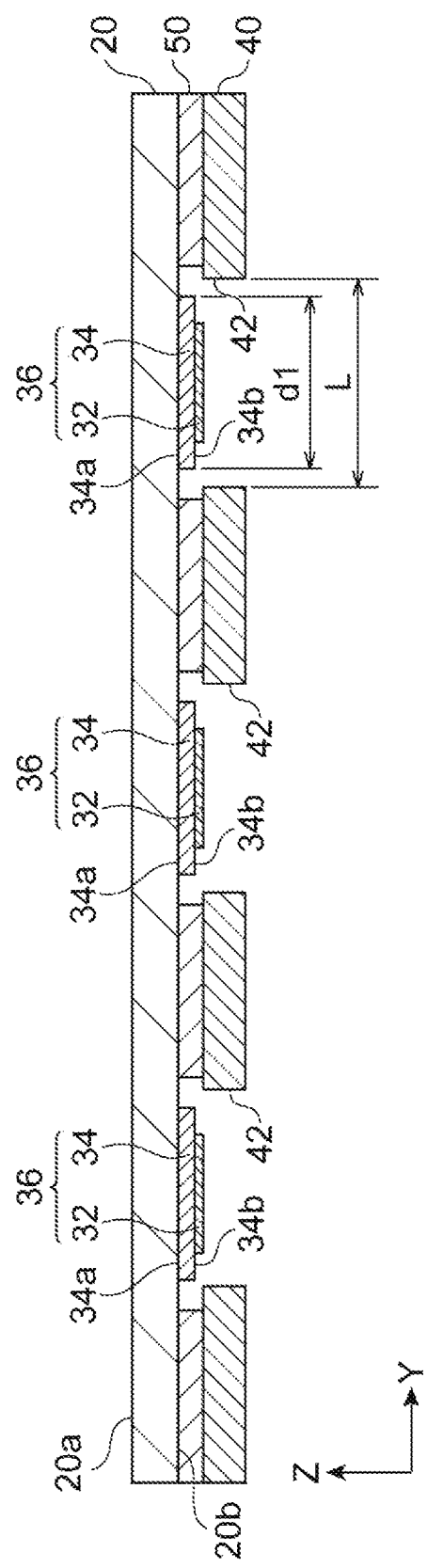
FIG. 4 is a cross-sectional view of the vibration unit taken along line IV-IV in FIG. 3.
Figure 5:
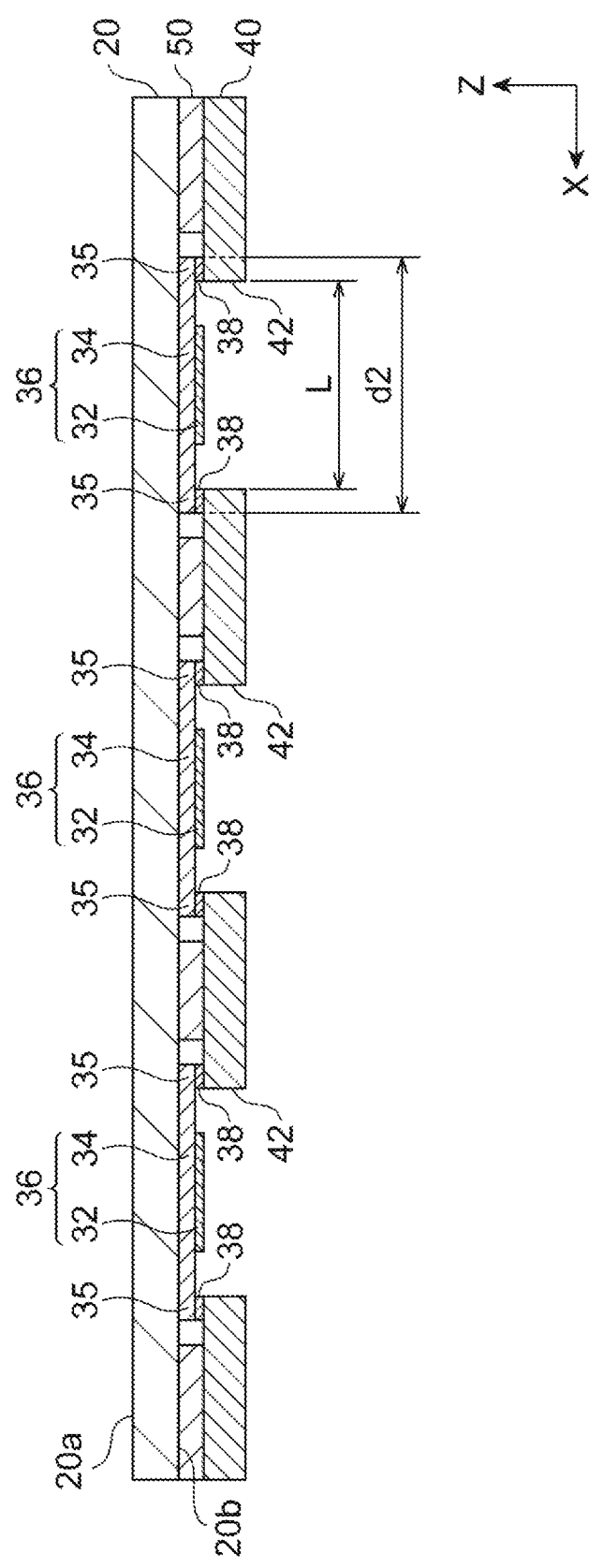
FIG. 5 is a cross-sectional view of the vibration unit taken along line V-V in FIG. 3.

As illustrated in FIG. 2, a plurality of the vibration plates 34 are arranged such that long side directions of all of the vibration plates 34 are the same directions, namely, are aligned with the X direction. Each of the vibration plates 34 is designed such that as illustrated in FIG. 4, a short side length d1 of the vibration plate 34 is shorter than a length L of one side of the square shape of the through hole 42 and as illustrated in FIG. 5, a long side length d2 of the vibration plate 34 is longer than the length L of one side of the square shape of the through hole 42. For this reason, a short side part 35 of the vibration plate 34 is positioned outside an edge 42a of the through hole 42 as seen from the Z direction, and is a supported portion that is supported on the second case member 40. In each of the vibration plates 34, only both of the short side parts 35 of the vibration plate 34 face the edge 42a of the through hole 42. Then, first bonding portions (support members) 38 for bonding to the second case member 40 are provided in both of the short side parts 35 of the vibration plate 34. The first bonding portion 38 is made of a bonding material such as a double sided tape or an ultraviolet curable adhesive.

In addition, the first case member 20 and the second case member 40 are fixed to each other in a bonding manner with a second bonding portion (bonding portion) 50 in a state where the first case member 20 is spaced the predetermined distance apart from the second case member 40. The second bonding portion 50 suppresses an offset in relative position between the first case member 20 and the second case member 40. When the first case member 20 is partially or entirely in close contact with the second case member 40 in a state where the first case member 20 is not spaced apart from the second case member 40, the displacement of the first case member 20 (flexure when the first case member 20 is pressed down with the finger or the like, or the transmission of vibrations from the vibration plate 34) can be restricted. The second bonding portion 50 is made of a bonding material such as a double sided tape or an ultraviolet curable adhesive. The second bonding portion 50 can be formed, for example, around the through hole 42. The second bonding portion 50 is formed apart from the vibration plate 34 such that the vibration of the vibration plate 34 of the vibration device 36 is not restricted.

The piezoelectric element 32 has a square sheet shape. The piezoelectric element 32 is arranged at the center position of the vibration plate 34, namely, at middle positions in the long side direction and a short side direction of the vibration plate 34. In addition, the entire outer edge of the piezoelectric element 32 is present inside the edge 42a of the through hole 42 as seen from the Z direction. The piezoelectric element 32 includes a piezoelectric body having a plate shape and a pair of external electrodes which are not illustrated. For example, the pair of external electrodes can be provided to face each other in the Z direction. The piezoelectric element 32 generates a potential difference between the pair of external electrodes according to an electromotive force induced when a displacement such as bending occurs in the piezoelectric body, and expands and contracts in an in-plane direction (direction parallel to an X-Y plane) when a predetermined voltage is applied between the pair of external electrodes. The piezoelectric body can have a single layer structure with a piezoelectric body layer, and can have also a multilayer structure where piezoelectric body layers and internal electrode layers are alternately stacked.

The external electrodes of the piezoelectric element 32 are electrically connected to a control unit 60 of the vibration unit 10. The control unit 60 can be formed of a circuit including a CPU and various electrical elements. The control unit 60 is configured to be able to detect the potential difference that occurs between the external electrodes due to the foregoing electromotive force of the piezoelectric element 32. In addition, the control unit 60 is configured to able to cause the piezoelectric element 32 to expand and contract by applying a voltage between the external electrodes of the piezoelectric element 32. For this reason, when the control unit 60 detects the electromotive force occurring between the external electrodes of the piezoelectric element 32, the control unit 60 can cause the piezoelectric element 32 to expand and contract by applying a voltage between the external electrodes of the piezoelectric element 32.

Then, when the piezoelectric element 32 expands and contracts in the direction parallel to the X-Y plane, the vibration plate 34 bonded to the piezoelectric element 32 bends in the Z direction. In this embodiment, since the vibration plate 34 has a rectangular shape and the long side length d2 is longer than the short side length d1, the vibration plate 34 bends in such a manner that the long side of the vibration plate 34 bends larger than the short side thereof.

When the control unit 60 periodically applies a voltage between the external electrodes of the piezoelectric element 32, the piezoelectric body of the piezoelectric element 32 expands and contracts repeatedly in the direction parallel to the X-Y plane, and therefore the vibration plate 34 bends repeatedly in the Z direction. As a result, vibrations occur in the vibration device 36 in the Z direction. In this embodiment, since the vibration plate 34 has a rectangular shape and the long side length d2 is longer than the short side length d1, vibrations which produce a large amplitude in the long side direction (X direction) occur. The through hole 42 of the second case member 40 is designed such that even when the vibration plate 34 bends, the main surface 34b does not come into contact with the second case member 40.

Figure 6:
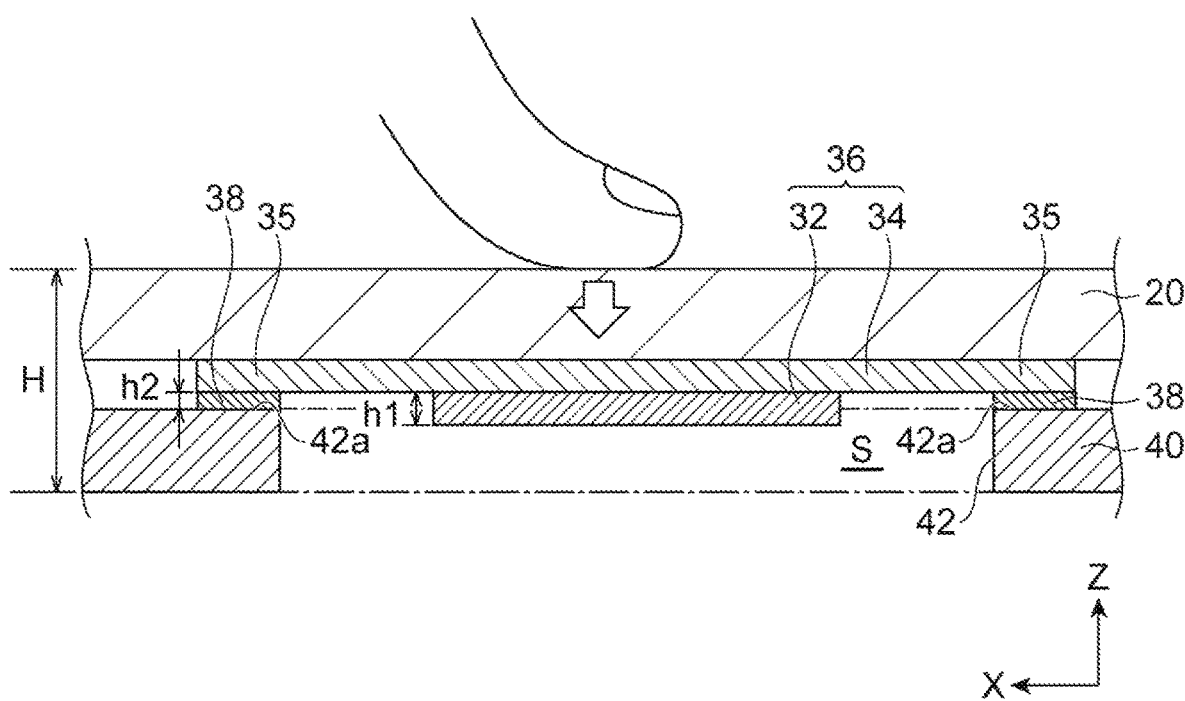
FIG. 6 is an enlarged view of a main part of FIG. 5.

As illustrated in FIG. 6, the design is done such that a height (length in the Z direction) h1 of the piezoelectric element 32 is higher than a height h2 of the first bonding portion 38 described above which supports the vibration plate 34 in the edge 42a of the through hole 42 of the second case member 40. For this reason, a lower portion of the piezoelectric element 32 enters an internal space S defined by the through hole 42 of the second case member 40 in the Z direction.

Subsequently, the operation of the vibration unit 10 described above will be described.

As illustrated in FIG. 6, when any one of the contact regions 22 of the first case member 20 of the vibration unit 10 is flexed toward the second case member 40, for example, by being pressed down with the finger, the vibration plate 34 overlapping the first case member 20 flexes according to the flexure, and also the piezoelectric element 32 overlapping the vibration plate 34 flexes. Therefore, an electromotive force occurs in the piezoelectric body of the piezoelectric element 32, so that a potential difference occurs between the pair of external electrodes. By detecting the potential difference occurring between the pair of external electrodes of the piezoelectric element 32, the control unit 60 detects contact with the specific contact region 22.

When the control unit 60 detects contact with the contact region 22, the control unit 60 drives the vibration device 36 corresponding to the contact region 22 which is contacted. Specifically, a periodic drive voltage (for example, a drive voltage with a waveform such as a square waveform or a triangular waveform) is applied to the vibration device 36. Then, as described above, vibrations occur in the vibration plate 34 of the vibration device 36 in the Z direction, and therefore also the contact region 22 of the first case member 20 which corresponds to the vibration device 36 under vibration vibrates in the Z direction. Namely, only the contact region 22 which is flexed vibrates selectively. At the time, vibrations occur in the contact region 22 to such an extent that the vibrations can be sensed with the finger or the like.

The first case member 20 can be designed with a relatively low modulus of elasticity such that the contact region 22 is flexed a sufficient amount and the vibration of the vibration device 36 is efficiently transmitted. On the other hand, the second case member 40 can be designed with a relatively high modulus of elasticity so as to support the vibration device 36. In this embodiment, the design is done such that the modulus of elasticity of the first case member 20 is lower than the modulus of elasticity of the second case member 40.

In the vibration unit 10 described above, at least a part (lower portion) of the piezoelectric element 32 enters the internal space S of the through hole 42; and thereby, the second case member 40 can be arranged more proximate to the first case member 20 than when the piezoelectric element 32 does not enter the internal space S of the through hole 42. Therefore, the thickness of the vibration unit 10 can be reduced, namely, a height H of the vibration unit 10 can be reduced. As described above, since the thickness of the vibration unit 10 is reduced, a size reduction of the vibration unit 10 is realized.

Particularly, the vibration unit 10 includes the plurality of vibration devices 36, and a size reduction in a configuration including the plurality of vibration devices 36 is realized.

In addition, in the vibration unit 10, since the vibration of the vibration plate 34 is attenuated in the first bonding portion 38 that is interposed between the short side part 35 of the vibration plate 34 and the second case member 40, the transmission of vibrations from the vibration plate 34 to the second case member 40 is suppressed.

As in this embodiment, when vibrations which produce a large amplitude in the long side direction occur in the vibration plate 34, a positional offset is likely to occur along the long side direction of the vibration plate 34. Therefore, in the vibration unit 10, the second case member 40 supports the short side part 35 of the vibration plate 34 via the first bonding portion 38; and thereby, a positional offset along the long side direction of the vibration plate 34 is suppressed. Moreover, a mutual influence between the vibration of the vibration plate 34 and the vibration of the vibration device 36 which is adjacent thereto in the long side direction (X direction) of the vibration plate 34 is suppressed.

One embodiment of the present disclosure has been described above; however, the present disclosure is not limited to the embodiment, and may be modified or applied in other forms without changing the concept described in each claim.

Figure 7:
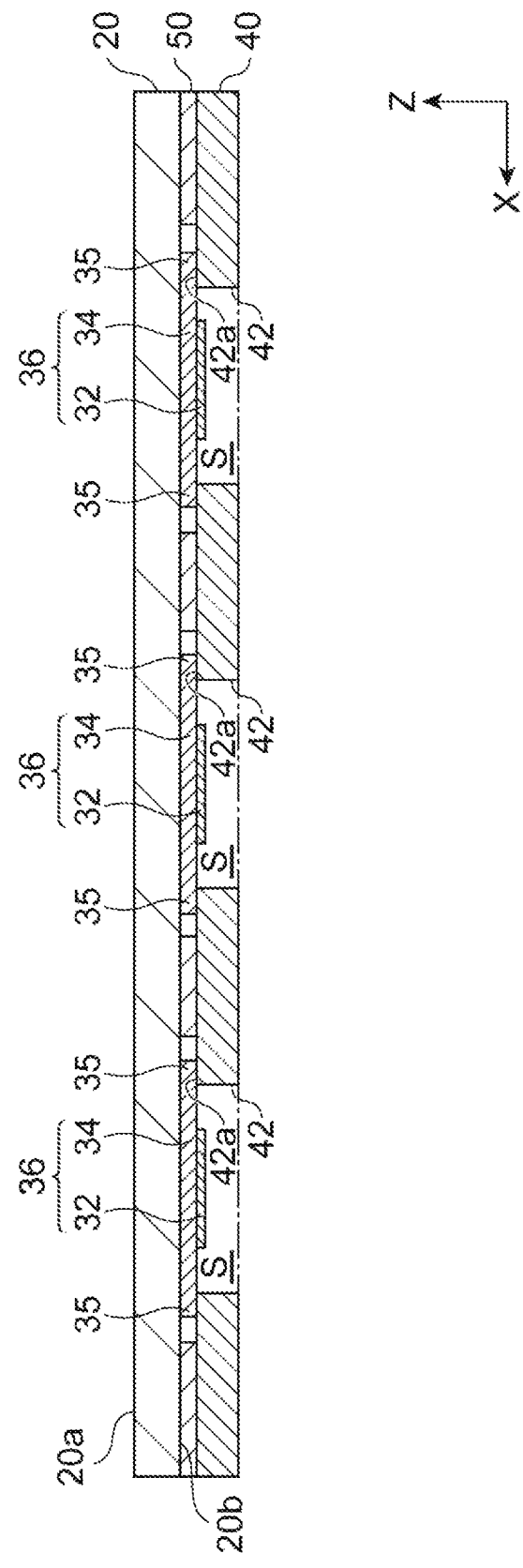
FIG. 7 is a cross-sectional view illustrating a vibration unit of another embodiment.

For example, as illustrated in FIG. 7, the short side part 35 of the vibration plate 34 is not necessarily supported on the edge 42a of the through hole 42 via the first bonding portion 38, and the first bonding portion 38 may be omitted and the short side part 35 may be supported to be in direct contact with the edge 42a of the through hole 42. In this case, the main surface 34b of the vibration plate 34 and an upper surface of the second case member 40 are present in substantially the same plane, and the entirety of the piezoelectric element 32 disposed on the main surface 34b of the vibration plate 34 enter the internal space S of the through hole 42. Therefore, it is possible to bring the second case member 40 proximate to the first case member 20, and it is possible to realize a further reduction in the thickness and the size of the vibration unit 10.

Figure 8:
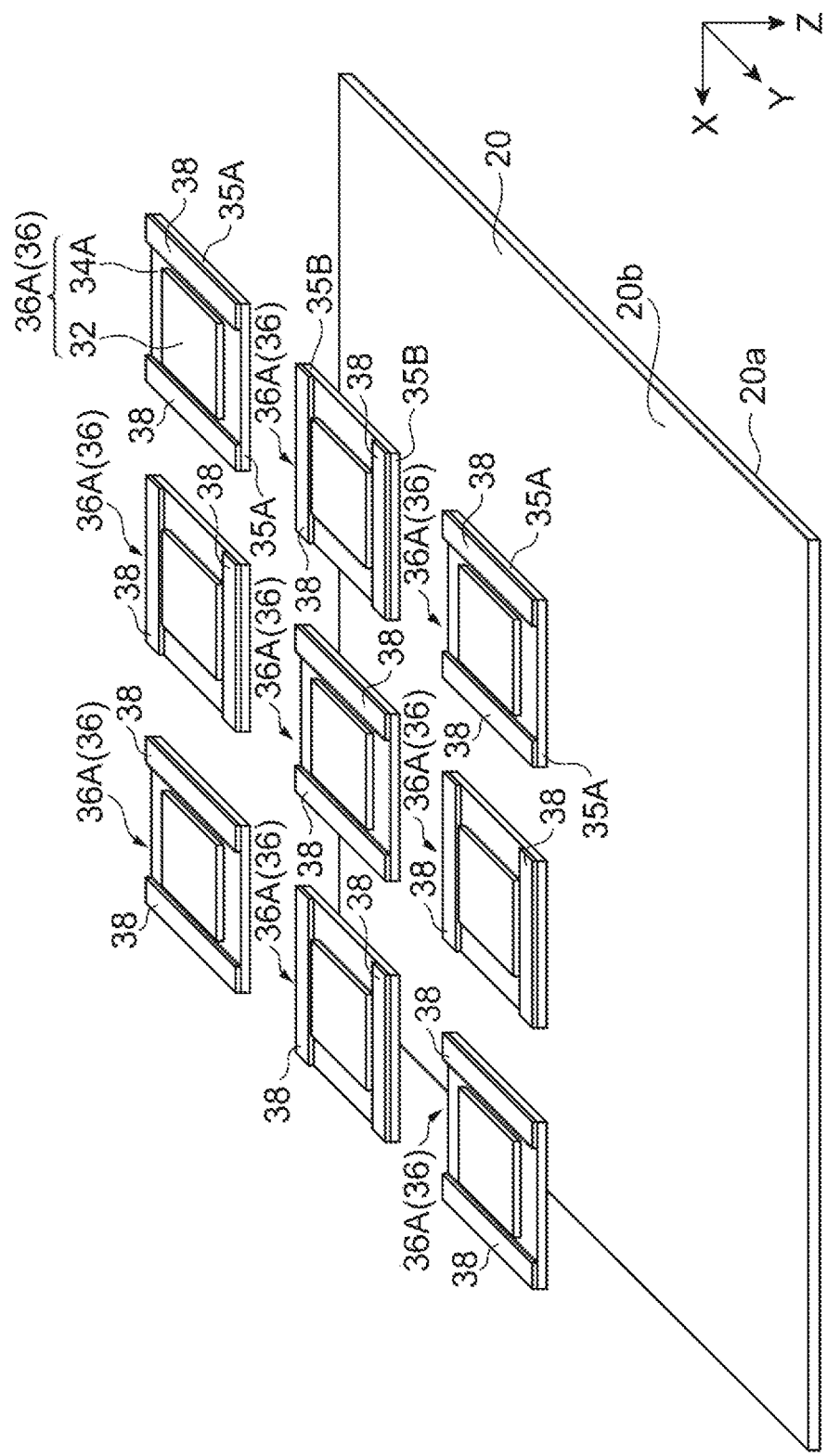
FIG. 8 is a schematic perspective view illustrating a vibration unit of another embodiment.

In addition, the vibration plate may have a square plate shape having a long side length which is longer than the length L of the side of the square shape of the through hole 42. In this case, as illustrated in FIG. 8, a vibration plate 34A of each of the plurality of vibration devices 36 has a pair of first sides parallel to each other and a pair of second sides different from the first sides, and as illustrated in FIG. 8, the plurality of vibration devices 36 can be arranged in the pattern of a matrix with three columns and three rows along a first direction (Y direction) parallel to the first sides and a second direction (X direction) parallel to the second sides.

In this case, the plurality of vibration devices 36 may be arranged in the X direction and the Y direction such that first vibration devices 36A in each of which only a first side part 35A which is a supported portion of the vibration plate 34 is supported on the second case member 40 via the first bonding portion 38 are adjacent to second vibration devices 36B in each of which only a second side part 35B which is a supported portion of the vibration plate 34 is supported on the second case member 40 via the first bonding portion 38. Since the first vibration devices 36A and the second vibration devices 36B are arrayed to alternately line up, a mutual influence between the vibrations of the vibration plates 34 in the vibration devices 36A and 36B adjacent to each other is suppressed.

Furthermore, in the foregoing embodiment, an aspect where the first case member and the second case member are separately formed has been described; however, an aspect where the first case member and the second case member are integrally formed may be adopted.

In addition, the hole provided in the second case portion may not be a through hole but a recess which is recessed away from the vibration plate as long as a space (internal space S) is secured in the hole to allow the bending of the vibration plate.

REFERENCE SIGNS LIST

10: vibration unit, 20: first case member, 32: piezoelectric element, 34: vibration plate, 35: short side part, 36: vibration device, 36A: first vibration device, 36B: second vibration device, 38: first bonding portion, 40: second case member, 42: through hole, 42a: edge, 50: second bonding portion, 60: control unit, S: internal space.

The invention claimed is:

1. A vibration unit comprising:
a first case portion having a plate shape;
a second case portion having a plate shape and extending parallel to the first case portion; and
a vibration device that is arranged on a second case portion side of the first case portion, and can vibrate in a thickness direction of the first case portion,
wherein the vibration device includes a vibration plate of which one main surface is in contact with the first case portion, and a piezoelectric element having a sheet shape which is arranged on the other main surface of the vibration plate and can expand and contract in an in-plane direction of the vibration plate,
a hole which is not in contact with the other main surface of the vibration plate is provided in the second case portion,
the vibration plate includes a supported portion that is positioned outside an edge of the hole as seen from the thickness direction of the first case portion, and the supported portion of the vibration plate is supported on the second case portion, and
an entire outer edge of the piezoelectric element is present inside the edge of the hole as seen from the thickness direction of the first case portion, and at least a part of the piezoelectric element enters an internal space of the hole in the thickness direction of the first case portion.

2. The vibration unit according to claim 1,
wherein a plurality of the vibration devices are arranged on the second case portion side of the first case portion, and
a plurality of the holes which correspond to the plurality of vibration devices are provided in the second case portion.

3. The vibration unit according to claim 2,
wherein the vibration plate of each of the plurality of vibration devices has a rectangular plate shape having long sides and short sides and long side directions of the vibration plates are aligned in the same direction,
the plurality of vibration devices form at least one row that lines up along the long side direction of the vibration plate, and
a short side part which is a supported portion of the vibration plate is supported on the second case portion.

4. The vibration unit according to claim 2,
wherein the vibration plate of each of the plurality of vibration devices has a square plate shape having a pair of first sides parallel to each other and a pair of second sides different from the first sides,
the plurality of vibration devices are arranged in a matrix pattern along a first direction parallel to the first sides and a second direction parallel to the second sides, and
the plurality of vibration devices are arranged in the first direction and the second direction such that first vibration devices in each of which only a first side part which is a supported portion of the vibration plate is supported on the second case portion are adjacent to second vibration devices in each of which only a second side part which is a supported portion of the vibration plate is supported on the second case portion.

5. The vibration unit according to claim 1, further comprising:

a support member that is interposed between the supported portion of the vibration plate and the second case portion.

6. The vibration unit according to claim 1, further comprising:
a bonding portion that is interposed between the first case portion and the second case portion and fixes the first case portion to the second case portion in a bonding manner.

7. The vibration unit according to claim 1,
wherein a modulus of elasticity of the first case portion is lower than a modulus of elasticity of the second case portion.

* * * * *